(12) United States Patent
Su et al.

(10) Patent No.: US 9,806,183 B2
(45) Date of Patent: Oct. 31, 2017

(54) STRESS CONTROL ON THIN SILICON SUBSTRATES

(71) Applicant: Veeco Instruments, Inc., Plainview, NY (US)

(72) Inventors: Jie Su, Metuchen, NJ (US); George Papasouliotis, Warren, NJ (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 14/953,792

(22) Filed: Nov. 30, 2015

(65) Prior Publication Data
US 2017/0154986 A1    Jun. 1, 2017

(51) Int. Cl.
| H01L 21/31 | (2006.01) |
| H01L 29/778 | (2006.01) |
| H01L 29/66 | (2006.01) |
| H01L 29/20 | (2006.01) |
| H01L 29/205 | (2006.01) |
| H01L 21/02 | (2006.01) |

(52) U.S. Cl.
CPC ...... *H01L 29/7783* (2013.01); *H01L 21/0254* (2013.01); *H01L 21/02639* (2013.01); *H01L 21/02647* (2013.01); *H01L 29/2003* (2013.01); *H01L 29/205* (2013.01); *H01L 29/66462* (2013.01)

(58) Field of Classification Search
None
See application file for complete search history.

(56) References Cited

U.S. PATENT DOCUMENTS

| 7,910,937 | B2 | 3/2011 | Chen | |
| 8,362,503 | B2 | 1/2013 | Saxler et al. | |
| 8,791,504 | B2 | 7/2014 | Chen et al. | |
| 2004/0119063 | A1* | 6/2004 | Guo | C30B 29/68 |
| | | | | 257/13 |
| 2004/0238842 | A1 | 12/2004 | Micovic et al. | |
| 2006/0073621 | A1 | 4/2006 | Kneissel et al. | |
| 2006/0191474 | A1* | 8/2006 | Chen | B82Y 20/00 |
| | | | | 117/104 |
| 2006/0286782 | A1* | 12/2006 | Gaska | C30B 25/02 |
| | | | | 438/483 |
| 2012/0292632 | A1 | 11/2012 | Shioda | |
| 2012/0295418 | A1* | 11/2012 | Melnik | H01L 21/0242 |
| | | | | 438/478 |

(Continued)

FOREIGN PATENT DOCUMENTS

| JP | 2001-077412 | 3/2001 |
| JP | 2004-247412 | 9/2004 |

OTHER PUBLICATIONS

International Search Report and Written Opinion from corresponding PCT application PCT/US2016/063869, dated Mar. 13, 2017.

*Primary Examiner* — Cory Eskridge
(74) *Attorney, Agent, or Firm* — Holzer Patel Drennan

(57) ABSTRACT

Methods for stress control in thin silicon (Si) wafer-based semiconductor materials. By a specific interrelation of process parameters (e.g., temperature, reactant supply, time), a highly uniform nucleation layer is formed on the Si substrate that mitigates and/or better controls the stress (tensile and compressive) in subsequent layers formed on the thin Si substrate.

12 Claims, 5 Drawing Sheets

Preflow Flux and Temperature vs Time

(56) References Cited

U.S. PATENT DOCUMENTS

| | | | |
|---|---|---|---|
| 2013/0026482 A1* | 1/2013 | Fenwick | H01L 21/02381 257/76 |
| 2014/0084296 A1 | 3/2014 | Yoshida | |
| 2014/0318592 A1 | 10/2014 | Sztein et al. | |
| 2015/0075431 A1 | 3/2015 | Barriss et al. | |
| 2017/0198410 A1 | 7/2017 | Fenwick et al. | |

* cited by examiner

STRESS CONTROL ON THIN SILICON SUBSTRATES

BACKGROUND

This disclosure is directed to methodologies for stress control in silicon (Si) wafer based semiconductor materials.

Mechanical stress, e.g., compressive stress and/or tensile stress, within a semiconductor device can detrimentally affect the semiconductor device's performance. It is thus desired to be able to control the mechanical stress levels in a semiconductor device in such a way that the undesirable properties are mitigated.

SUMMARY

This disclosure is directed to stress control in thin silicon (Si) wafer-based semiconductor materials. With a specific interrelation of process parameters (e.g., temperature, gas supply, time), a highly uniform seed or nucleation layer can be formed on the Si substrate that mitigates stress (tensile and compressive) in subsequent layers formed on the thin Si substrate.

That is, the processes of this disclosure involve specific interrelation of process parameters (e.g., gas reactant flow or flux, temperature, time) for better nucleation control, leading to precise stress control (tensile and compressive) for controlled or controllable substrate bow (concave and convex) after cool-down of the stack. This is particularly suitable for AlGaN HEMT stack on Si (111) substrates having a semi-standard thickness.

In one specific implementation, this disclosure describes a method of forming a semiconductor device on a substrate having a thickness no greater than 1 mm. The method comprises initiating a first reactant flow and obtaining a plateau flow rate, and after reaching the first reactant plateau flow rate, initiating a second reactant flow and obtaining a plateau flow rate. After the second reactant plateau flow rate, the temperature is at least 1000° C.

In another specific implementation, this disclosure describes another method of forming a semiconductor device on a substrate having a thickness no greater than 1 mm. The method comprises providing a source of aluminum (Al)-containing reactive species to a flow plateau during a preflow period at a temperature of 550-1050° C., and after the preflow period, providing a source nitrogen (N)-containing reactive species to a plateau, where during the preflow period there is no N-containing reactive species flow. After the Al-containing reactive species plateau and the N-containing reactive species plateau, the temperature is held above 1000° C., e.g., 1010-1050° C.

In another specific implementation, this disclosure describes a semiconductor device on a silicon (Si) substrate having a thickness no greater than 1 mm. The device has a nucleation layer on the substrate, a stress control structure on the nucleation layer, a high electron mobility transistor (HEMT) on the stress control structure, and a passivation cap layer on the HEMT. The semiconductor device has a bow across the device of no more than 20 micrometers.

These and various other features and advantages will be apparent from a reading of the following detailed description.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTION

Figure 1:
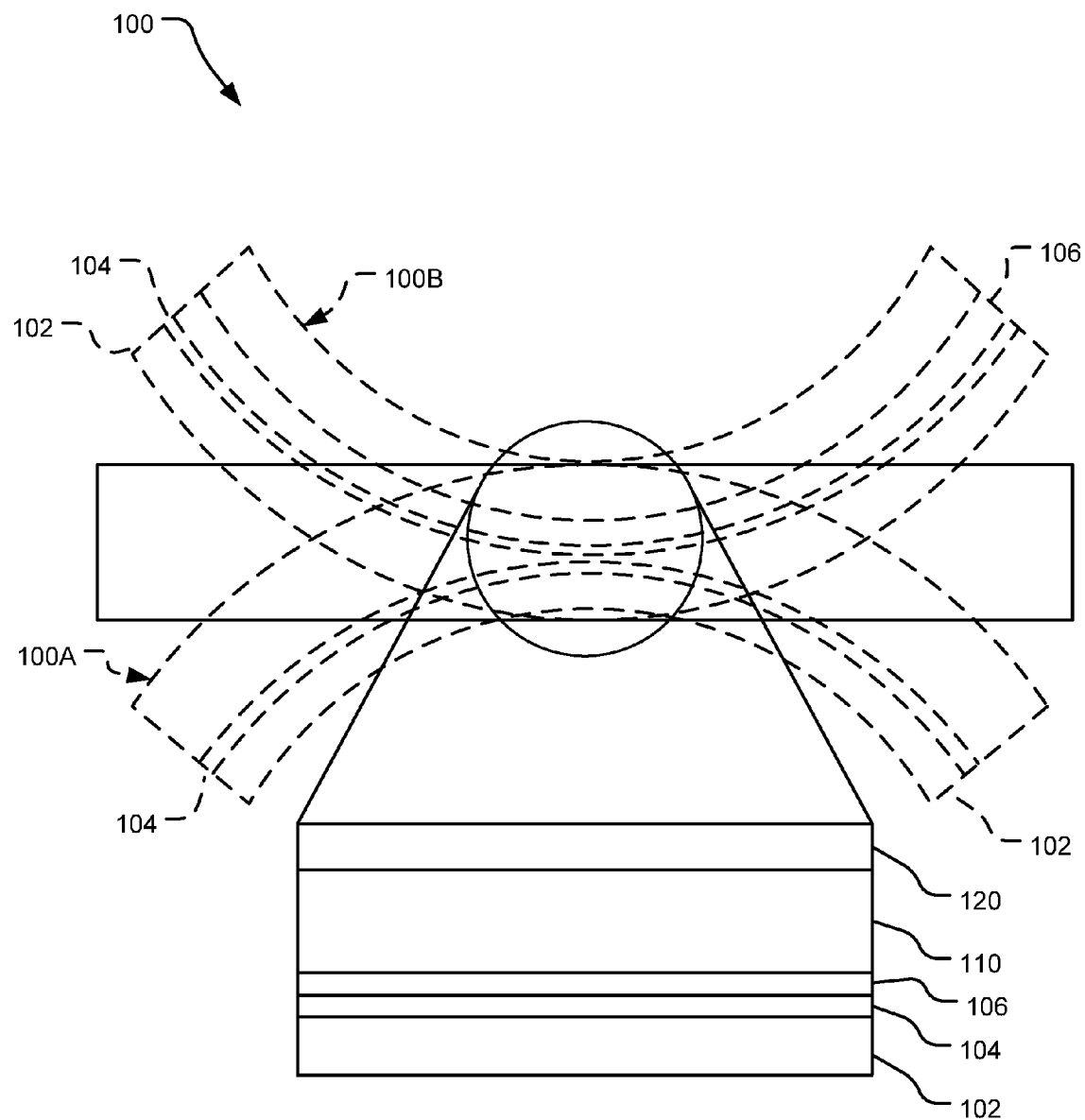
FIG. 1 is a schematic side view of an example semiconductor structure having a silicon (Si) substrate and a nucleation layer for stress control in the structure.

A high-electron-mobility transistor (HEMT), also known as heterostructure field effect transistor (HFET) or modulation-doped FET (MODFET), is a field-effect transistor that has a junction between two materials with different band gaps (i.e., a heterojunction) as the channel. When the blocking layer in the HEMT is AlGaN, the device is a double heterostructure field effect transistor (DHFET), compared to single heterostructure field effect transistors (SHFETs).

DHFETs, such as AlGaN/GaN/AlGaN DHFETs with thick AlGaN blocking layer (e.g., >2 μm), have much higher breakdown strength and enhanced channel carrier confinement compared to SHFETs. In AlGaN/GaN/AlGaN DHFETs, the breakdown voltage and carrier confinement increases (which is desired) with the level of Al and the thickness of the AlGaN blocking layer. However, the heteroepitaxy of DHFETs with AlGaN blocking layer on a Si (111) substrate is more challenging compared to SHFETs with GaN blocking layer. Not enough compressive stress is build up during the AlGaN deposition, resulting in increased concave bowing in the structure after cool-down and extended edge cracks in the epilayers.

For wide adoption of AlGaN-based DHFETs in electronic applications, Si (111) substrates with semi-standard thickness are used for compatibility with existing standard Si-based CMOS fabrication facilities, processes and equipment. Common semi-standard thicknesses are 675 micrometers for a 150 mm (6 inch) wafer, 725 micrometers for a 200 mm (8 inch) wafer, and 775 micrometers for a 300 mm (12 inch) wafer. Additionally, using the thin, semi-standard thick Si substrates eliminates the need to thin the Si wafer post-growth. However, the epitaxy of AlGaN based DHFETs on Si substrates with semi-standard thicknesses is extremely challenging due to the large wafer bow during growth and after cool-down.

The present disclosure is directed to stress control in a wafer, particularly a silicon (Si) substrate or wafer, such as these thin, semi-standard thick Si (111) substrates, by including a highly uniform nucleation layer on the Si substrate. The nucleation layer is formed using specific process parameters. The highly uniform nucleation layer facilitates mitigation of stress (tensile and compressive) by any stress control (e.g., buffer) structure on the substrate, especially when the substrate is a thin Si substrate having a thickness no greater than 1 mm (1000 micrometers). The methods of this disclosure can be used to form HEMTs and SHFETs, and are particularly suited for forming DHFETs.

In the following description, reference is made to the accompanying drawing that forms a part hereof and in which are shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. For example, although the following detailed description refers to DHFETs, the discussion is also applicable to other devices such as HEMTs and SHFETs. While the present disclosure is not so limited, an appreciation of various aspects of the disclosure will be gained through a discussion of the examples provided below.

FIG. 1 shows a semiconductor material 100 that includes a base substrate 102 with a nucleation layer 104 on top thereof. On the nucleation layer 104 is a buffer or stress control structure 106, a double heterostructure field effect transistor (DHFET) 110 and a passive cap layer 120.

FIG. 1 also shows, in phantom, a convex semiconductor material 100A and a concave semiconductor material 100B. When the stress control structure 106, which has a lattice constant that is mismatched from the lattice constant of the substrate 102, is formed on the substrate 102 and the nucleation layer 104, the stress control structure 106 has a tensile stress associated with it, which causes the stress control structure 106 and the substrate 102/nucleation layer 104 to distort and bend in a convex manner, resulting in a convex semiconductor material 100A. When the cap layer 120, which has a lattice constant greater than the stress control structure 106, are formed on the stress control structure 106, the cap layer 120 has a compressive stress associated with it, which causes the entire structure to distort and bend in a concave manner, resulting in concave semiconductor material 100B.

To inhibit the bending and distortion of both the concave material 100B and the convex material 100A, the nucleation layer 104 on which the subsequent layers (e.g., the stress control structure 106, the DHFET 110, the cap layer 120, etc.) are formed is highly uniform in thickness, composition, and surface roughness.

Figure 2:
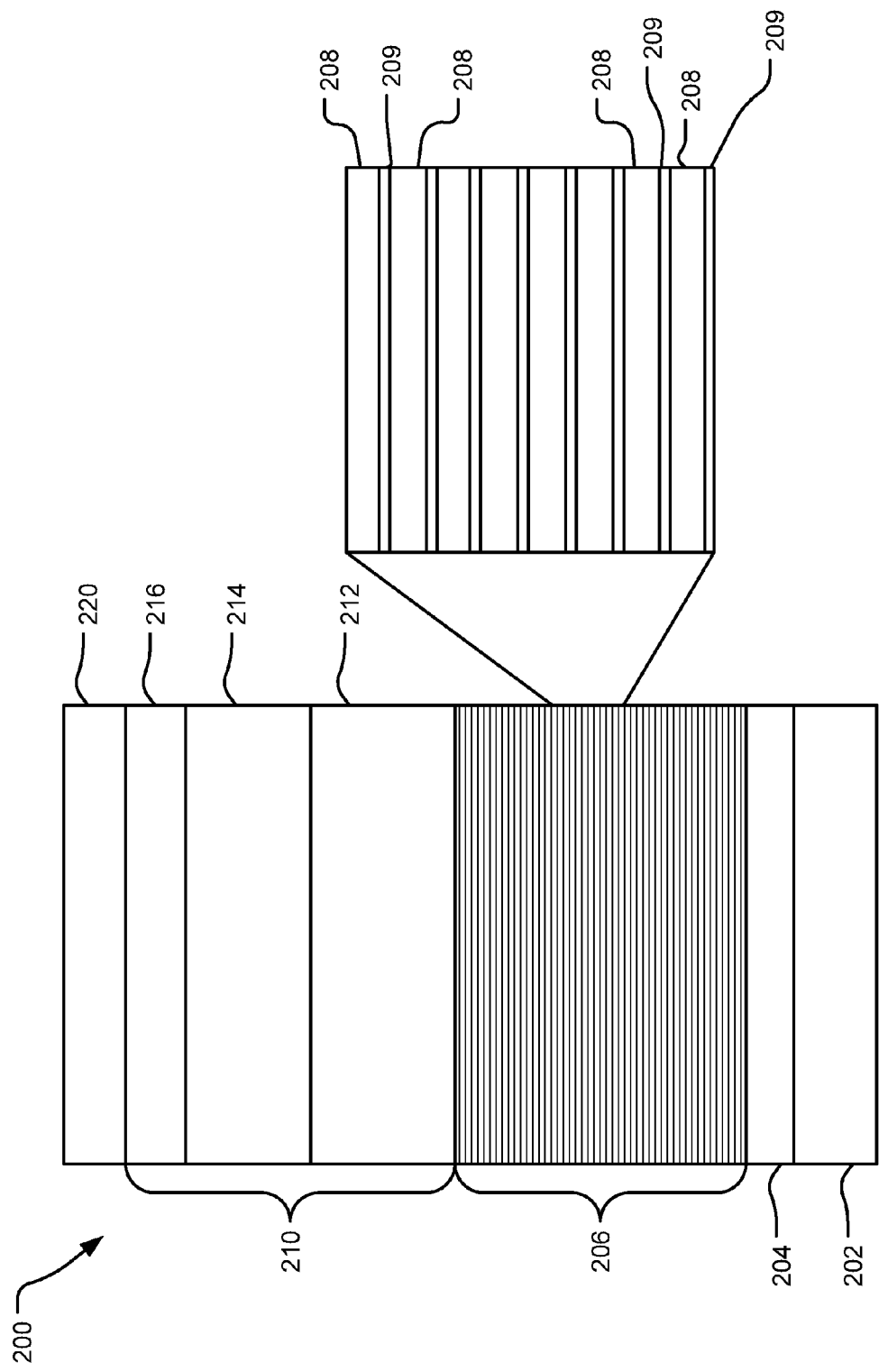
FIG. 2 is schematic side view of an implementation of a semiconductor structure having a nucleation layer for stress control in the structure.

FIG. 2 illustrates an implementation of a semiconductor device having a stress mitigating nucleation layer on a Si substrate. In FIG. 2, a semiconductor device 200 has a thin (i.e., no greater than 1 mm thick) Si substrate 202. Immediately on and in contact with the substrate 202 is a nucleation layer 204; this nucleation layer 204 has been formed by the process described below, and is highly uniform.

Present on the nucleation layer 204 is a buffer or stress control structure 206, in this particular implementation, a superlattice structure composed of alternating layers 208, 209 of materials, e.g., having different lattice constants. The alternating layers 208, 209 of the superlattice structure result in alternating layers of compressive stress and tensile stress. In some implementations, the number of layers 208 is the same as the number of layers 209, whereas in other implementations, there is one more layer of one of layers 208 or layers 209. At least one pair of alternating layers 208, 209 is present. In some implementations, at least 50 pairs of layers are present, e.g., about 50 to 100 pairs of layers. In other implementations, more or less pairs of layers are present. Example thicknesses for layers 208, 209 include from 3 nm to 30 nm, although thinner and/or thicker layers can be used. In some embodiments, the layer 208 and the layer 209 have the same thickness, whereas in other embodiments one of the layers 208, 209 is thicker than the other.

This superlattice stress control structure 206 provides a base for a DHFET structure 210 and subsequent passivation cap layer 220. A superlattice structure, such as Al(Ga)N/(Al)GaN, is included for stress control for the epitaxy of the DHFET structure 210, particularly on Si (111) substrates with semi-standard thickness (i.e., no greater than 1 mm). The DHFET structure 210 includes a blocking layer 212, a channel layer 214, and a barrier layer 216. Together, the stress control structure 206 (e.g., the superlattice structure), the DHFET 210 and the cap layer 220 counteract any internal stresses due to the application of the layers on the Si substrate 202, resulting in a flat semiconductor device 200.

To build enough compressive stress in the blocking layer 212, the superlattice structure is grown with a positive/flat/negative slope with the increase of superlattice pairs or layers 208, 209 to adjust the compressive stress in the blocking layer 212 or maximum wafer bow during epitaxy. The wafer bow at room temperature depends on the residual stress after compensation by the tensile stress during cooldown. In one embodiment, the average composition of the superlattice structure is modulated as a function of process time/stack thickness by adjusting the thickness or composition of the constituent layers 208, 209.

In one particular implementation of the semiconductor device 200, an aluminum nitride (AlN) nucleation layer 204 has a thickness of about 200 nm with a variation of no more than 100 nm, the stress control structure 206 is a 1-5 μm thick superlattice structure composed of gallium nitride (GaN) layers 208 and aluminum nitride (AlN) layers 209, the blocking layer 212 is $Al_xGa_{1-x}N$ (0≤x<1) and at least 2 micrometers thick, the channel layer 214 is GaN and 0.3 to 0.5 micrometers thick, the barrier layer 216 is about 20 nm thick $Al_{0.25}Ga_{0.75}N$, and the passivation cap layer 220 is an in situ grown GaN or SiNx layer. In other implementations, the superlattice stress control structure 206 is composed of $Al_xGa_{1-x}N$ (0<x<1) layers 208 and the layers 209 selected from AlN, $Al_yGa_{1-y}N$, where 0<y<1, and mixtures thereof, with the superlattice layers 208, 209 arranged in any order to form the superlattice structure.

In some implementations, the blocking layer 212, particularly an AlGaN blocking layer, can be doped with carbon (C), magnesium (Mg), iron (Fe), nickel (Ni), or other dopant to enhance the resistivity by compensating the unintentionally doped impurities in any other layer, such as a GaN layer.

Figure 3:
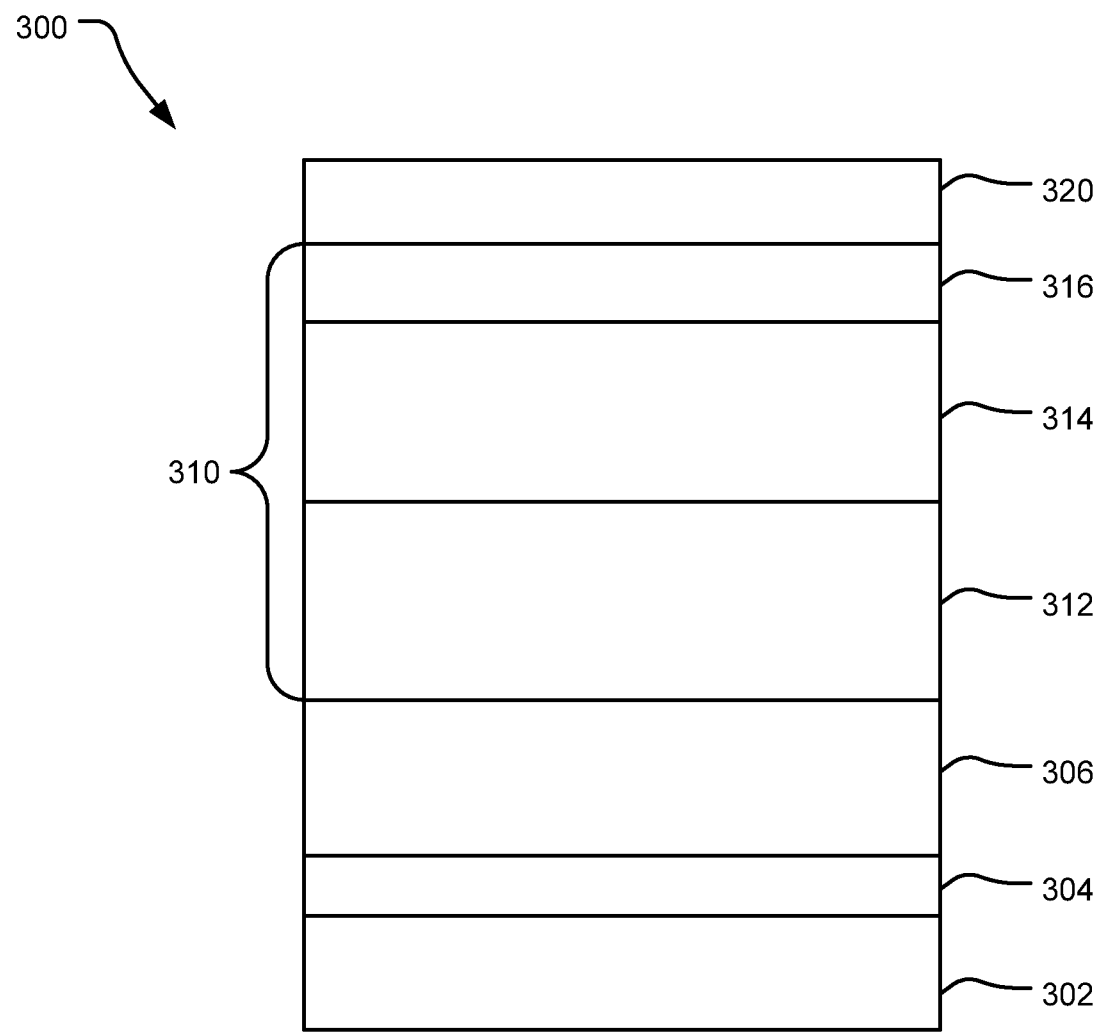
FIG. 3 is schematic side view of another implementation of a semiconductor structure having a nucleation layer for stress control in the structure.

FIG. 3 illustrates another implementation of a semiconductor device having a stress mitigating nucleation layer on a Si substrate. In FIG. 3, a semiconductor device 300 has a thin (i.e., no greater than 1 mm thick) Si substrate 302. Immediately on and in contact with the thin Si substrate 302 is a nucleation layer 304; this nucleation layer 304 has been formed by the process described below, and is highly uniform.

Present on the nucleation layer 304 is a buffer or stress control structure 306, in this particular implementation, "n" stepped layers (with n≥1) of $Al_xGa_{1-x}N$, wherein 0.05<x<0.95 (e.g., $Al_{0.75}Ga_{0.25}N$, $Al_{0.50}Ga_{0.50}N$, and $Al_{0.25}Ga_{0.75}N$, or, $Al_{0.7}Ga_{0.3}N$, $Al_{0.45}Ga_{0.55}N$, and $Al_{0.2}Ga_{0.8}N$, or $Al_{0.7}Ga_{0.3}N$, $Al_{0.42}Ga_{0.58}N$, and $Al_{0.2}Ga_{0.8}N$). The stress control structure 306 provides a base for a DHFET structure 310 and subsequent passivation cap layer 320. The DHFET structure 310 includes a blocking layer 312, a channel layer 314, and a barrier layer 316. Together, the stress control structure 306, the DHFET 310 and the cap layer 320 counteract any internal stresses due to the application of the layers on the Si substrate 302, resulting in a flat semiconductor device 300. The nucleation layer 304 provides a uniform base for the layers 306, 310, and 320.

In one particular implementation of the semiconductor device 300, an AlN nucleation layer 304 has a thickness of about 200 nm, the stress control structure 306 is approximately a 1 micrometer thick n-step structure composed of at least one $Al_xGa_{1-x}N$ layer, where $0.05<x<0.95$, the blocking layer 312 is AlGaN and at least 2 micrometers thick, the channel layer 314 is GaN and 0.3 to 0.5 micrometers thick, the barrier layer 316 is about 20 nm thick $Al_{0.25}Ga_{0.75}N$, and the passivation cap layer 320 is an in situ grown GaN or SiNx layer. In an exemplary implementation, the stress control structure 306 is composed of ordered layers of $Al_{0.75}Ga_{0.25}N$, $Al_{0.50}Ga_{0.50}N$, and $Al_{0.25}Ga_{0.75}N$, although in other implementations, more layers (e.g., 5 layers, e.g., $Al_{0.8}Ga_{0.2}N$, $Al_{0.6}Ga_{0.4}N$, $Al_{0.4}Ga_{0.6}N$, $Al_{0.2}Ga_{0.8}N$, and $Al_{0.1}Ga_{0.9}N$) can be present and/or the elemental distribution can be different. For example, the stress control structure 306 can be composed of non-ordered or staggered layers (e.g., $Al_{0.75}Ga_{0.25}N$, $Al_{0.25}Ga_{0.75}N$, and $Al_{0.50}Ga_{0.50}N$), so that the stress is staggered. By varying the percentage of Al and the thickness of the AlGaN layers, the starting curvature for the blocking layer 312 can be adjusted, which is then used to control the maximum wafer bow during epitaxy and at room temperature after cool-down.

In some implementations, the blocking layer 312, particularly an AlGaN blocking layer, can be doped with C, Mg, Fe, Ni, or other dopant to enhance the resistivity by compensating the unintentionally doped impurities in any other layer, such as a GaN layer.

An example implementation of the semiconductor device 300 has a n-step stress control structure 306 composed of three layers $Al_{0.75}Ga_{0.25}N$, $Al_{0.50}Ga_{0.50}N$, and $Al_{0.25}Ga_{0.75}N$, and a 2 micrometer thick blocking layer 312 composed of C—AlGaN, the C present at a level of $1\times10^{19}/cm^3$; an exemplary device with such a structure can have a total thickness, not including the Si substrate, of about 3.5 micrometers, and in some implementation about 4 to 5 micrometers. A particular example of a C—AlGaN suitable for the blocking layer 312 is C—$Al_{0.1}Ga_{0.9}N$. A C—AlGaN blocking layer, which can have an Al percentage from >0% to 100% (i.e., from C-$Al_{>0}Ga_{<100}N$ to C—AlN) has a higher breakdown strength ($V_{BD}$/micrometer) than a comparable thickness C—GaN blocking layer.

The nucleation layers 204, 304 are formed by the process described herein. Although an AlN nucleation layer on the Si substrate is described above and further below, the nucleation layer can be another nitrogen (N) containing material, such as boron nitride (BN) or aluminum boron nitride (AlBN), or silicon carbide (SiC). Similarly, although the blocking layers 212, 312 have been described above as AlGaN, the blocking layer can be, e.g., GaN, AlBN, or a superlattice structure of Al(Ga)N/(Al)GaN. As indicated above, the blocking layer can additionally optionally be doped, such as with C or other impurities; this doping may be intrinsically or extrinsically. Further, although the channel layers 214, 314 have been described above as GaN, AlGaN with low levels of impurities could alternately be used. The barrier layers 216, 316 can be AlN or any AlGaN having the Al present at 25% or greater. Additionally, although the cap layers 220, 320 have been described above as GaN or SiNx, the cap layer 220, 230 could be another dielectric material, such as SiO, AlN, $Al_2O_3$, HfO, etc.

As shown in FIG. 2 and in FIG. 3, above, the semiconductor devices include a stress control structure; the device 200 of FIG. 2 includes the superlattice stress control structure 206 and the device 300 of FIG. 3 includes the n-step stress control structure 306. Both the superlattice stress control structure 206 and the n-step stress control structure 306 provide stress control for the epitaxy of the DHFET structure on Si (111) substrates. With a highly uniform nucleation layer, these stress control structures 206, 306 readily compensate any stresses in the device, particularly on Si substrates with semi-standard and thin thickness (i.e., no greater than 1 mm).

In order to form the highly uniform nucleation layer (e.g., nucleation layer 204, 304), which results in mitigation of uncontrollable or uncompensatable stress by the stress control structure (e.g., stress control structure 206, 306), the nucleation layer formation process, including the reactant preflow process, is carefully controlled. It has been found that by carefully controlling interrelation of the reactant flow or flux, time, and temperature during and after the preflow process, highly uniform nucleation layers, particularly AlN nucleation layers with minimal surface pits and cracks, can be formed, resulting in a device with minimal wafer bow. Careful control of the reactant flow, time and temperate produces a highly uniform nucleation layer that thus enhances the compressive stress in the adjacent stress control structure, which is then compensated by the adjacent blocking layer.

Although the process of forming the nucleation layer and any of the layers of the semiconductor device can be done in any suitable deposition reactor, whether a single wafer reactor or multiple wafer reactor or batch reactor (for either a single wafer or multiple wafers), it was found that a single wafer, rotating disk, metal organic chemical vapor deposition (MOCVD) reactor allowed good process control. Rotating disk MOCVD reactors provide homogeneous flow distribution and uniform temperature profiles, which translates into excellent uniformity and concentric symmetry in the epilayer (nucleation layer) thickness and alloy composition, which results in uniform and controllable stress in epilayers across Si substrates.

The epitaxial growth of the nucleation layer is carried out in a reactor (e.g., an MOCVD reactor) equipped with the appropriate subsystems for in situ substrate heating, precise gas supply control, thorough effluent removal, precise gas flow monitoring and control, and tight pressure and temperature monitoring and control. The reactor can be part of a cluster tool; in such an implementation, different layers of the epi heterostructure (i.e., semiconductor device) can be grown in different chambers of the cluster tool, each optimized for the specific process step and layer.

An example of a suitable MOCVD reactor system is described in U.S. Patent Application Publication 2015/0075431 by Barriss et al., the entire disclosure of which is incorporated herein by reference. Such a MOCVD reactor is particular suited for the process of this disclosure, as the reactor includes hardware for precise gas supply control, thorough effluent removal, precise gas flow monitoring and control, and tight pressure and temperature monitoring and control. This MOCVD reactor, plus others that are particularly suited for the process of this disclosure, have a reactant flow flange (also referred to as a 'shower head') and a highly accurate mass flow controller proximate the top of the MOCVD reactor, which provide and distribute the reactant (s) downward through the reactor chamber. Effluent removal equipment (e.g., pump(s)) may be proximate the bottom of the reactor chamber, close to where the wafer is positioned during processing. Another example of a suitable MOCVD reactor system is described in U.S. Pat. No. 5,855,681, the entire disclosure of which is incorporated herein by reference. Other examples of suitable MOCVD reactors are described in U.S. Pat. Nos. 9,018,105; 8,986,453; 8,906,456; 8,062,426; 6,899,764; 6,837,940, and 6,309,465 and U.S. Patent Application Publications 2014/0287142; 2014/0030434; 2013/0167771; 2012/0160170; 2012/0156396; 2012/0149212, and 2012/0103265, the entire disclosures of which are incorporated herein by reference.

Figure 4:
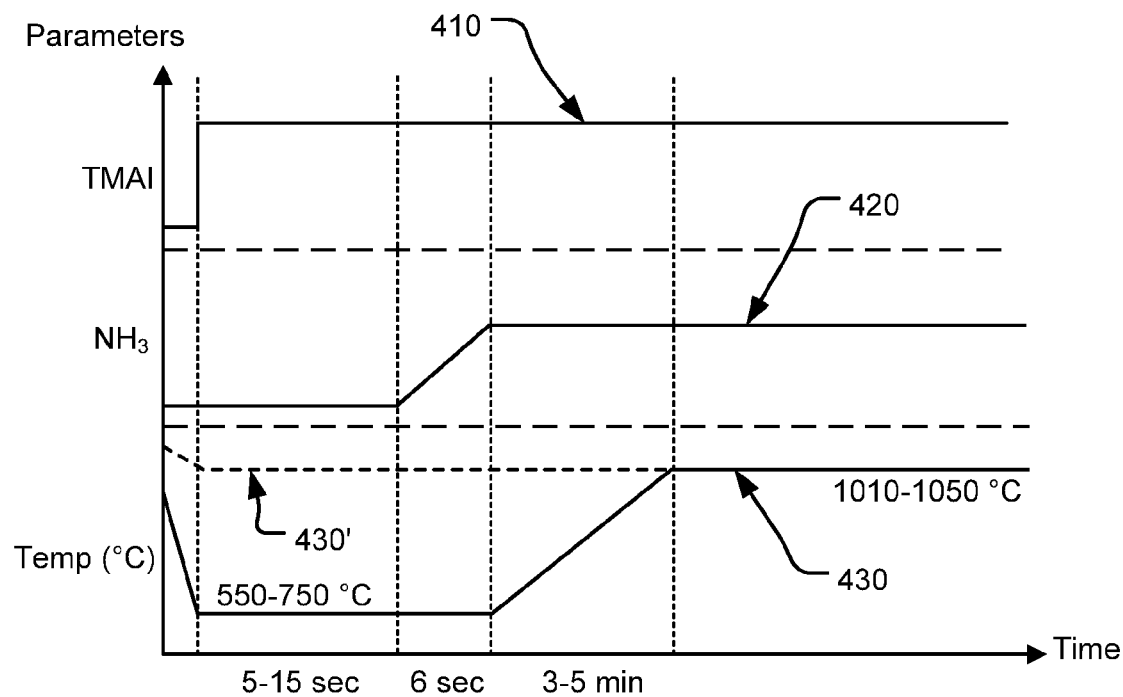
FIG. 4 is a graphical representation of process parameters for forming a nucleation layer.

FIG. 4 illustrates the flux or flow for two reactants and the temperature over time for forming (e.g., depositing) of the nucleation layer on a thin Si substrate.

Although FIG. 4 is particularly directed to a process for forming an AlN nucleation layer on a thin Si substrate, including a semi-standard thickness Si substrate, the general teachings from FIG. 4 can be implemented for other nucleation layers, such as BN, AlBN, and SiC. For the formation of the AlN layer, a source of Al-containing reactive species and a source of N-containing reactive species are provided to the reactor; trimethyl aluminum (TMAl) gas is the source of Al-containing reactive species and ammonia ($NH_3$) is the source of N-containing reactive species.

The TMAl flow, the flow rate of which is identified as curve 410, is a step function that remains essentially constant for the during of the nucleation layer deposition. The 'step' of curve 410 is the indicator to begin timing the subsequent curves.

Figure 5:
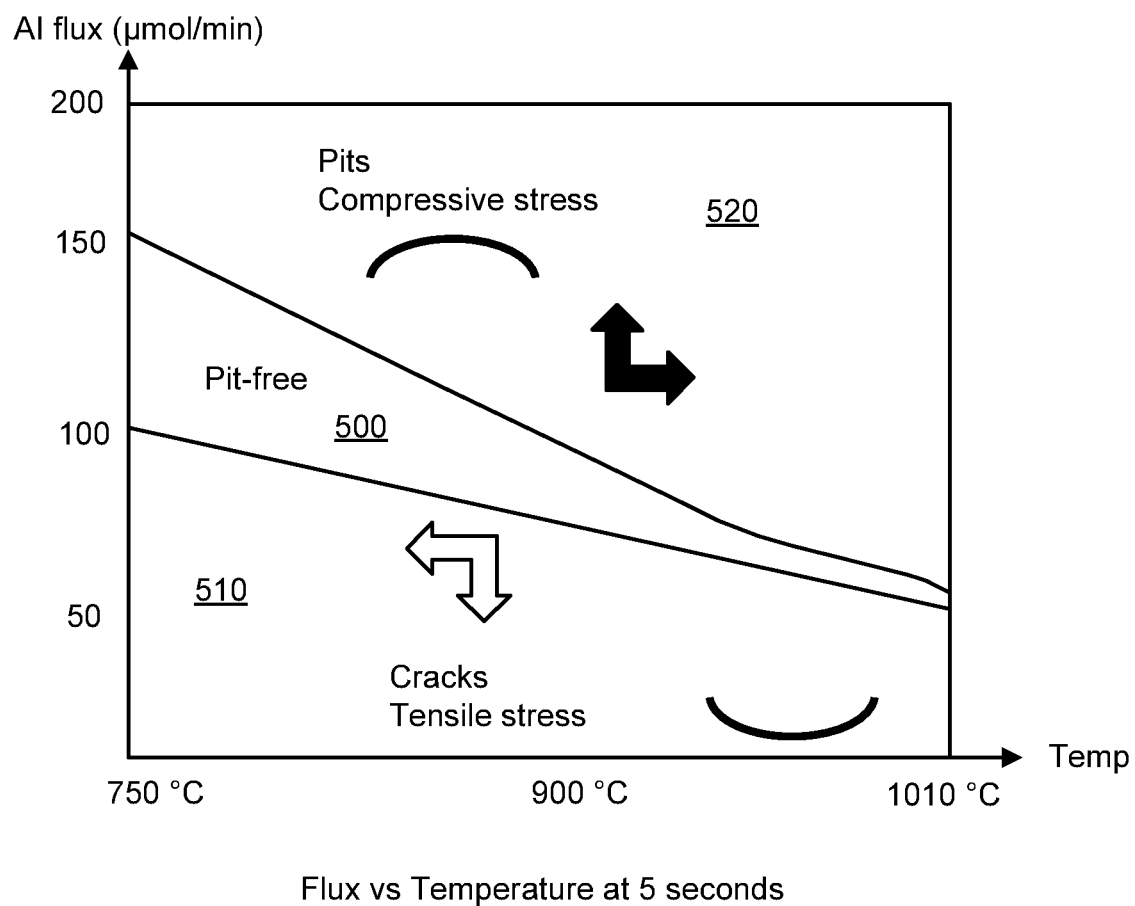
FIG. 5 is another graphical representation of process parameters for forming a nucleation layer.

The TMAl flow rate 410, after the step, is between 50 micromols/min and 175 micromols/min, depending on the temperature of the reactor; in some implementations, the flow rate 410 is between 100 micromols/min and 150 micromols/min. FIG. 5, discussed further below, shows a relationship between the TMAl flow rate 410 and process temperature. The TMAl flow rate remains essentially level for the remainder of the deposition of the nucleation layer.

Continuing with FIG. 4, the $NH_3$ flow rate, identified as curve 420, is a ramped function, the onset of which is delayed 5 to 15 seconds after the step of TMAl curve 410. This time before the onset of the $NH_3$ flow is referred to as the Al-preflow or preflow. Prior to the initiation of the ramp (5 to 15 seconds after the step of the TMAl), the $NH_3$ flow is none; that is, during the preflow there is no $NH_3$ flow. The ramp up of the $NH_3$ flow occurs over about 6 seconds, although in other implementations the ramp may be quicker or slower. The final or plateau $NH_3$ flow rate 420, after the ramp, is between 1 and 20,000 micromols/min, e.g., between 1 and 1,000 micromols/min, between 1,000 and 20,000 micromols/min, and remains essentially level for the remainder of the deposition of the nucleation layer. In other implementations, the flow rate measurement is in sccm (standard cubic centimeters/minute).

FIG. 4 also shows the reactor temperature during the TMAl flow and the $NH_3$ flow. In a first implementation, identified as temperature curve 430, the temperature of the reactor is within the range of 550-750° C. at the time of the step of TMAl curve 410 and the ramp of $NH_3$ curve 420. After the $NH_3$ flow levels, the temperature increases over 3-5 minutes to above 1000° C., e.g., to 1010-1050° C., and remains level for the remainder of the deposition of the nucleation layer. In an alternate implementation, identified as temperature curve 430', the temperature of the reactor is above 1000° C., e.g., within the range of 1010-1050° C., at the time of the step of TMAl curve 410 and the ramp of $NH_3$ curve 420, and the temperature remains level for the remainder of the deposition of the nucleation layer. Although only two curves 430, 430' are shown for temperature, the temperature could be anywhere between 550° C. and 1050° C. during the preflow process.

It is understood that depending on the properties of the hardware in the reactor, a truly ideal step for the TMAl curve 410 may not be achievable or may be difficult to achieve; however, it was found that the better the TMAl flow control, the more uniform the nucleation layer. Depending on the capabilities of the reactor, one solution is to wait to initiate the $NH_3$ flow 420 and the temperature change until after the TMAl flow has reached the desired flow rate. Thus, it is the TMAl flow being at its plateau that is the indicator to begin timing the $NH_3$ flow curve 420 and temperature curves 430, 430'.

FIG. 5 shows an example relationship between TMAl flow and temperature and the resulting AlN nucleation layer on a thin Si substrate; this particular example is at 5 seconds into the preflow process, after the TMAl flow has stepped (see, FIG. 4) to plateau and no $NH_3$ is yet flowing. FIG. 5 shows desired TMAl flow (identified as Al flow on the graph) as related to reactor temperature.

Within the region 500, the AlN nucleation layer is pit-free and highly uniform. In the region 510, pits in the surface of the nucleation layer are evident and the thin Si substrate with the nucleation layer has an overall convex shape due to the compressive stress in the nucleation layer. Conversely, in the region 520, cracks are found in the surface of the nucleation layer, and the thin Si substrate with the nucleation layer has an overall concave shape due to the tensile stress in the nucleation layer.

When the temperature of the reactor is approximately 750° C., the desired TMAl flow rate, for an essentially pit-free layer with a controllable bow, is between 100 and 150 micromols/min; higher than 150 micromols/min the nucleation layer is pitted and not uniform, and less than 100 micromols/min the seen layer is cracked. As the temperature of the reactor increases, the needed flow rate of TMAl to obtain the uniform nucleation layer decreases, as does the window or range of acceptable TMAl flow rates. Thus, the lower the temperature, the wider the TMAl range or process window.

As indicated, FIG. 5 is for a particular process at 5 seconds into the preflow process. At other times (e.g., 10 seconds into the preflow process), the acceptable process region (500), will be shifted, in some implementations, down for a lower TMAl flow.

The previous graphs, FIGS. 4 and 5, were obtained from various epitaxy process experiments carried out in a state-of-art Veeco Propel™ Power GaN MOCVD system, with a 200 mm (8 inch), 725 micrometer thick single Si wafer. The system was equipped with a DRT-210 in-situ process monitor (integrated pyrometer-reflectometer-deflectometer unit) for temperature, reflectance and wafer curvature measurements. The evolution of growth stress was monitored in real-time through the change of wafer curvature using the in-situ deflectometer.

It was experimentally shown that by using the process parameters reported in FIGS. 4 and 5, that a full semiconductor device having a DHFET with an AlGaN blocking layer can be formed on a 200 mm (8 inch), 725 micrometer thick Si substrate while maintaining any bow in the device to less than 20 micrometers, in some implementations less than 15 micrometers across the device. It was also experimentally shown that by using the process parameters, a full semiconductor device having a DHFET with a C—AlGaN blocking layer and a 3 step AlGaN stress control structure can be formed on a 150 mm (6 inch), 1 mm thick Si substrate while maintaining any bow in the device to less than 40 micrometers and as low as 25 micrometers. In one particular experiment, a 4 micrometer thick, 3 step AlGaN HEMT was formed on a 200 mm (8 inch), 725 micrometer thick Si substrate, and the resulting wafer has a bow of about 8 micrometers, specifically, 8.11 micrometers. The process parameters are also applicable to other semi-standard or thin (i.e., no greater than 1 mm thick) Si (111) substrates.

The above specification provides a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, any numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "bottom," "lower", "top", "upper", "beneath", "below", "above", "on top", "on," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A method of forming a highly uniform nucleation layer of a semiconductor device on a substrate having a thickness no greater than 1 mm, the method comprising:

providing a flow of an aluminum (Al)-containing reactive species to a plateau during a preflow period at a temperature of 550-750° C.;

after the preflow period, providing a flow of nitrogen (N)-containing reactive species to a plateau while maintaining the Al-containing reactive species flow plateau during the N-containing reactive species flow plateau, where during the preflow period there is no N-containing reactive species flow; and after reaching the Al-containing reactive species flow plateau and the N-containing reactive species flow plateau, maintaining the Al-containing reactive species flow plateau and the N-containing reactive species flow plateau and holding at a temperature of above 1000° C.

2. The method of claim 1, further comprising after reaching the Al-containing reactive species flow plateau and the N-containing reactive species flow plateau, holding at a temperature of 1010-1050° C.

3. The method of claim 1, wherein providing the flow of N-containing reactive species to the plateau comprises ramping the N-containing reactive species flow to the plateau.

4. The method of claim 1, wherein providing the flow of N-containing reactive species to the plateau comprises stepping the N-containing reactive species flow to the plateau.

5. The method of claim 1, wherein the preflow period is 5-15 seconds.

6. The method of claim 1, wherein after at least 5 seconds at the Al-containing reactive species flow plateau, initiating the N-containing reactive flow and obtaining the N-containing reactive species flow plateau.

7. The method of claim 6, wherein the N-containing reactive flow is initiated between 5 and 15 seconds after the Al-containing reactive species flow plateau.

8. The method of claim 1, wherein after at least 3 minutes at the N-containing reactive species flow plateau, having the temperature of at least 1000° C.

9. The method of claim 1, wherein after at least 3 minutes at the N-containing reactive species flow plateau, the temperature is between 1010° C. and 1050° C.

10. The method of claim 1, wherein after between 3 and 5 minutes at the N-containing reactive species flow plateau, the temperature is ramped up to at least 1000° C.

11. The method of claim 1, wherein the Al-containing reactive species is trimethyl aluminum (TMAl).

12. The method of claim 1, wherein the N-containing reactive species is ammonia ($NH_3$).

* * * * *